United States Patent
Tournier et al.

(10) Patent No.: US 11,923,465 B2
(45) Date of Patent: Mar. 5, 2024

(54) PHOTODIODE COMPRISING A MEMORY AREA

(71) Applicant: STMicroelectronics (Crolles 2) SAS, Crolles (FR)

(72) Inventors: Arnaud Tournier, Grenoble (FR); Boris Rodrigues Goncalves, Theys (FR); Frederic Lalanne, Bernin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 198 days.

(21) Appl. No.: 17/125,654

(22) Filed: Dec. 17, 2020

(65) Prior Publication Data
US 2021/0193849 A1    Jun. 24, 2021

(30) Foreign Application Priority Data

Dec. 19, 2019  (FR) ..................................... 1914879
Dec. 19, 2019  (FR) ..................................... 1914885

(51) Int. Cl.
*H01L 31/02*  (2006.01)
*H01L 27/146*  (2006.01)

(52) U.S. Cl.
CPC .. *H01L 31/02019* (2013.01); *H01L 27/14603* (2013.01); *H01L 27/14609* (2013.01); *H01L 27/1463* (2013.01); *H01L 31/02005* (2013.01); *H01L 27/14643* (2013.01)

(58) Field of Classification Search
CPC ......... H01L 27/14603; H01L 27/14609; H01L 27/1463; H01L 27/14643; H01L 31/02005; H01L 31/02019
See application file for complete search history.

(56) References Cited

U.S. PATENT DOCUMENTS

| | | |
|---|---|---|
| 8,513,761 B2 | 8/2013 | Roy et al. |
| 9,236,407 B2 | 1/2016 | Roy et al. |
| 9,673,247 B2 | 6/2017 | Roy et al. |
| 2005/0069293 A1 | 3/2005 | Monoi |
| 2009/0266973 A1 | 10/2009 | Roy et al. |
| 2012/0161213 A1 | 6/2012 | Roy et al. |
| 2014/0183685 A1* | 7/2014 | Roy ................... H01L 27/1463 257/443 |
| 2015/0279878 A1 | 10/2015 | Ahmed et al. |
| 2015/0372031 A1 | 12/2015 | Yoon, et al. |
| 2016/0118432 A1 | 4/2016 | Cazaux et al. |
| 2016/0366350 A1* | 12/2016 | Roffet ............... H01L 27/14612 |
| 2017/0125474 A1 | 5/2017 | Roy et al. |
| 2017/0278892 A1 | 9/2017 | Roy |
| 2018/0302582 A1* | 10/2018 | Roy ...................... G01S 7/4863 |
| 2022/0005850 A1* | 1/2022 | Inard ................. H01L 27/14609 |
| 2022/0077208 A1* | 3/2022 | Saxod ............... H01L 27/14616 |

FOREIGN PATENT DOCUMENTS

| | | |
|---|---|---|
| EP | 2752878 A2 | 7/2014 |
| FR | 2 980 641 A1 | 3/2013 |
| JP | 2010114461 A | 5/2010 |

* cited by examiner

*Primary Examiner* — Yara B Green
*Assistant Examiner* — Christopher M Roland
(74) *Attorney, Agent, or Firm* — Seed IP Law Group LLP

(57) ABSTRACT

The present disclosure concerns a photodiode including at least one memory area, each memory area including at least two charge storage regions.

17 Claims, 12 Drawing Sheets

PHOTODIODE COMPRISING A MEMORY AREA

This application claims the priority benefit of French patent application number 19/14885 and French patent application number 19/14879, both filed on Dec. 19, 2019, the contents of which are hereby incorporated by reference in its entirety.

BACKGROUND

Technical Field

The present disclosure generally concerns electronic components and, more particularly, photodiodes comprising a memory area.

Description of the Related Art

Photodiodes are semiconductor components, each comprising a PN junction. Photodiodes have the ability of detecting a light radiation, for example, in the optical domain, and of transforming it into an electric signal.

Image sensors are electronic devices, each comprising a plurality of photodiodes. The photodiodes enable the device to obtain an image of a scene at a given time. The image is formed of a pixel array, the information of each pixel being obtained by one or plurality of photodiodes. For example, the information generally corresponds to an amount of electrons obtained by a photodiode at a given time, this amount of electrons being converted by the image sensor into color levels (red, green, or blue) or into grey levels.

During a first operating step during which a photodiode receives radiations from a scene, the photodiode may for example store the electrons obtained in memory areas, that is, electron storage areas. During a second operating step, the quantity of electrons located in the memory areas is read. This value is then representative of the quantity of radiation received from the scene.

BRIEF SUMMARY

An embodiment provides a photodiode comprising at least one memory area, each memory area comprising at least two storage regions, the charge storage regions being coupled by first and second openings.

According to an embodiment, the first opening is at least partially covered with a connection pad.

According to an embodiment, the second opening is not covered with the connection pad.

According to an embodiment, the connection pad is a pad for reading a value representative of the charge quantity in the memory area.

According to an embodiment, the second opening is located at closest to the pad without being located under the pad.

According to an embodiment, the main directions of the storage regions of a same memory area are parallel.

According to an embodiment, the storage regions are at least partially surrounded with first insulated conductive walls.

According to an embodiment, each insulated conductive wall comprises a conductive core configured to receive, during the photodiode operation, a negative voltage, the insulating core being at least partially surrounded with an insulating coating.

According to an embodiment, the first and second openings are separated by a portion of the second insulated conductive wall.

According to an embodiment, the first insulated conductive walls comprise portions located on either side of the second opening and extending towards the second opening.

Another embodiment provides a method of use of a photodiode such as previously described, comprising a first step during which electrons are generated and are stored in the memory area(s) and a second step of reading out the quantity of electrons in the memory area(s).

According to an embodiment, the portion receives a negative voltage during the first step.

According to an embodiment, the voltage received by the portion reaches a positive value during the second step.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. For example, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. For example, the electronic devices comprising the pixels, for example, the image sensors, will not be detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and in some embodiments, within 5%.

Figure 1:
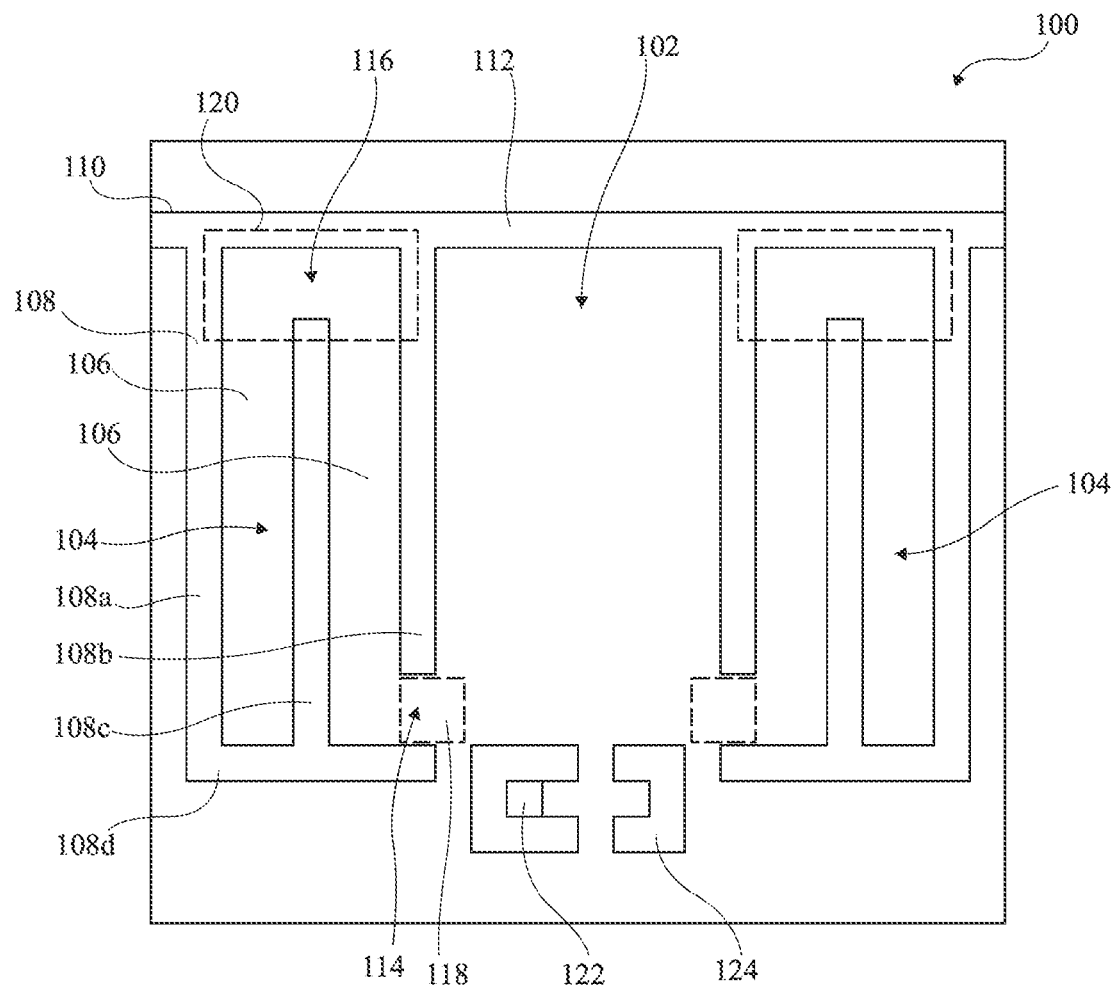
FIG. 1 shows an embodiment of a photodiode.

FIG. 1 shows an embodiment of a photodiode 100. FIG. 1 is a top view of photodiode 100.

Photodiode 100 comprises an active area 102, located in a semiconductor substrate, for example, and made of silicon. Active area 102 is the semiconductor area receiving radiations and generating electric charges, for example, electrons. Active area 102 for example comprises a PN junction, for example, a PN junction comprising horizontal semiconductor layers.

Photodiode 100 comprises memory areas 104 in the substrate. Each memory area 104 is an area having charges stored therein, for example, in electron storage areas. Each memory area 104 is for example an area of the semiconductor substrate having photodiode 100 formed therein.

In the example of FIG. 1, photodiode 100 comprises two memory areas 104.

Memory areas 104 are located on either side of active area 102.

Each memory area 104 comprises at least two electron storage regions 106. In the example of FIG. 1, each memory area 104 comprises two electron storage regions 106. Each electron storage region 106 for example substantially has the shape of a parallelogram.

It is considered that the main direction of an electron storage region 106 is the direction of the largest dimension in the plane of FIG. 1. In the example of FIG. 1, the main directions of the storage regions 106 of a same memory area 104 are parallel. In the example of FIG. 1, the main directions of the storage regions 106 of the different memory areas 104 are parallel.

In the example of FIG. 1, the storage regions 106 of a same memory area 104 have identical dimensions. However, the regions may have different dimensions. For example, the two regions 106 may have a substantially equal width. For example, one of the two regions may have a length greater than that of the other region 106. For example, the storage region 106 most distant from active area 106 may have a length greater than the length of the active area 106 closest to active area 102.

Width of one of storage areas 106 the dimension in the direction perpendicular to the main direction of this region in the plane of FIG. 1. Length of one of storage regions 106 the dimension in the main direction of storage region 106.

Each memory area 104 is surrounded with insulated conductive walls 108, except for an input region of the memory area. Insulated conductive walls 108 receive, during the operation of photodiode 102, a negative voltage.

Each insulated conductive wall 108 comprises a conductive core and an insulating coating, not shown in FIG. 1. The conductive core is for example made of metal. The coating is for example made of silicon oxide. The conductive core is for example coupled to a node of application of a voltage. The insulating coating surrounds the conductive core, except, for example, for the connections with the voltage source. For example, the insulating coating separates the conductive core from the active area 102 of photodiode 100 and electron storage regions 106. The insulating coating for example entirely covers the lateral walls and the bottom of the conductive core. The insulating coating for example partially covers the upper surface of the conductive core.

In the example of FIG. 1, each memory area 104 comprises three insulated conductive walls 108a, 108b, and 108c extending in the main direction of storage regions 106. Walls 108a and 108b form the lateral walls of memory area 104. Wall 108c forms the separation between the two storage regions 106. Each memory area 104 further comprises one or a plurality of walls 108 coupling some of the three walls 108a, 108b, and 108c on one side of memory area 104. In the example of FIG. 1, photodiode 100 comprises a single wall 108d coupling walls 108a and 108c on one side of the memory area. The other side of memory area 104 is for example separated from a strip 110 extending along photodiode 100 by an insulated conductive wall 112. Wall 112 couples walls 108a and 108b. Insulated conductive wall 112 comprises, like walls 108, a conductive core and an insulating coating similar to the core and to the coating of walls 108. Wall 112 extends, in the example of FIG. 1, along the portion of strip 110 extending along photodiode 100. Wall 112 is thus common to the two memory areas of photodiode 100. Wall 112 further separates active area 102 from strip 110.

Strip 110 is for example a conductive strip. Strip 110 is for example a reading strip enabling to read from the photodiode, that is, to obtain a voltage representative of the quantity of charges in memory areas 104.

For each memory area 104, wall 108a extends from wall 112 to wall 108d. Walls 108b and 108c partially extend from wall 112 to wall 108d. Wall 108b comprises an opening 114 forming the input of memory area 104. Opening 114 is, in the example of FIG. 1, located between wall 108b and wall 108d. Opening 114 enables the electrons generated in active area 102 to pass into memory area 104.

Similarly, wall 108c comprises an opening 116. Opening 116 forms the connection between the two electron storage regions 106. Opening 116 enables electrons to pass from one region to the other. Opening 116 is, in the example of FIG. 1, between 108c and wall 112.

Openings 114 and 116 are, in some embodiments, located at opposite ends of memory area 104, in the main direction of regions 106.

A conductive pad 118 is located above each opening 114, that is, above each input of memory areas 104. In FIG. 1, there thus are two conductive pads 118, each coating a portion of the semiconductor substrate having active area 102 and memory areas 104 formed therein.

A conductive pad 120 is located above each opening 116. Each conductive pad 120, in some embodiments, totally covers opening 116. In the example of FIG. 1, conductive pad 120 partially covers strip 110, wall 112, and the portions of memory area 104 in contact with wall 112. For example, conductive pad 120 partially covers walls 108a, 108b, and 108c extending in the main direction of storage regions 106.

In the example of FIG. 1, photodiode 100 further comprises a region 122 of semiconductor material partially surrounded with insulated conductive walls 124. In the example of FIG. 1, region 122 is surrounded with two walls 124, each having a U shape in the plane of the drawing.

Region 122 is for example connected to a node of application of a voltage.

As a variation, elements 122 and 124 may be absent.

During a first operating step, electrons are generated in active area 102. Region 122 and pads 120 receive negative voltages. Conductive pads 118 receive a positive voltage, to attract electrons towards memory areas 104. The electrons fill the electron storage region 106 closest to opening 114, after which the electrons flowing through opening 116 fill the storage region most distant from opening 114.

During a second operating step, region 122 receives a positive voltage to attract the new generated electrons. This enables to make sure that the quantity of electrons read from the memory areas is representative of the scene at a given time. Pads 118 receive a negative voltage and pads 120 receive a positive voltage.

All along the operation of the photodiode, insulated conductive walls 108 and 112 receive a negative voltage, for example, approximately equal to −2 V or −2.5 V.

The operation of the photodiode will be described in further detail in relation with FIGS. 5, 6, 7, and 8.

Figure 2:
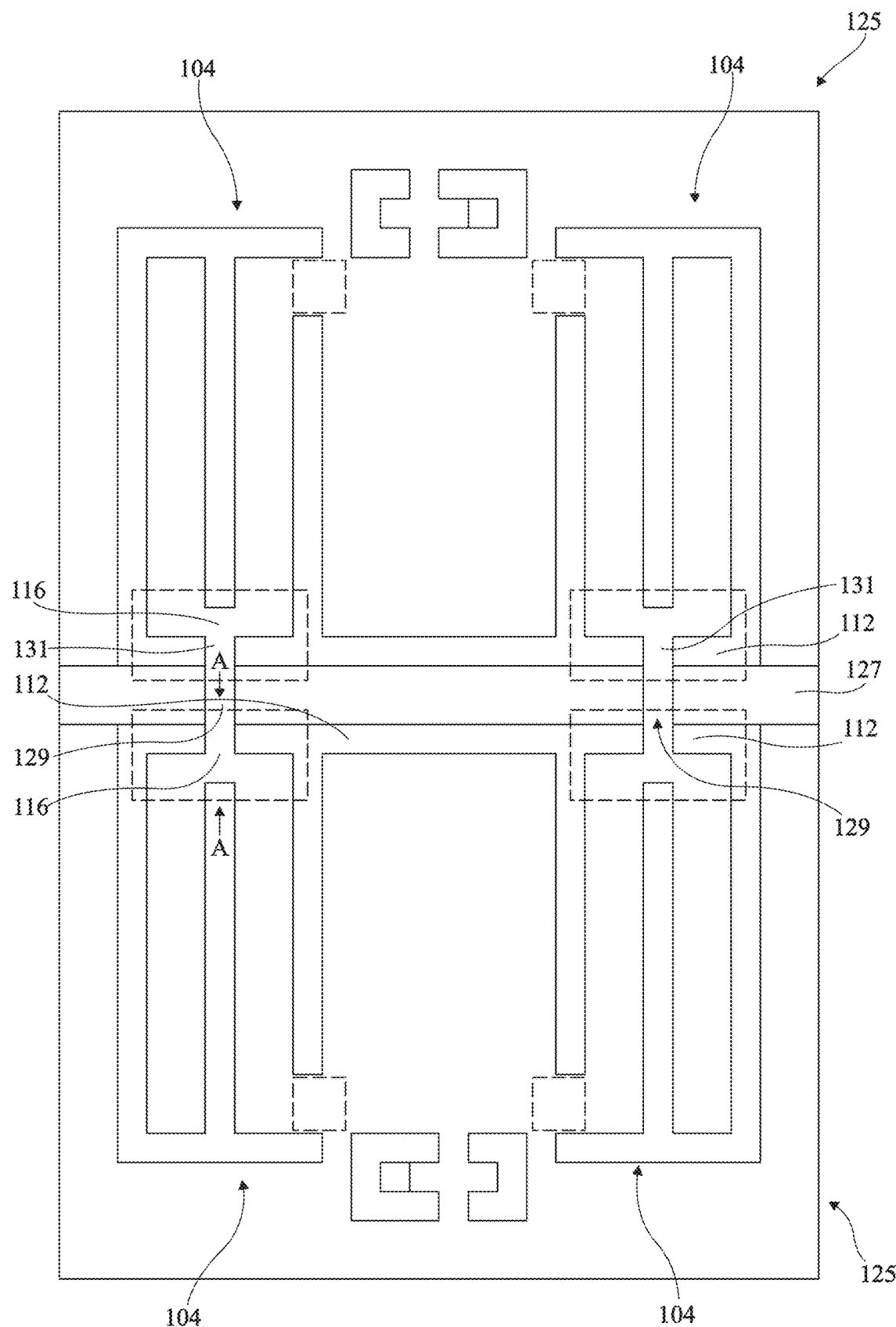
FIG. 2 shows another embodiment of a photodiode.

FIG. 2 shows another embodiment of photodiodes 125. FIG. 2 shows two photodiodes 125.

Each of the two photodiodes 125 comprises the same elements as the photodiode 100 of FIG. 1, bearing the same references, except for strip 110 and walls 112. Identical elements will not be detailed again. Strip 110 is replaced with a strip 127. Strip 127 is, like strip 110, a conductive strip. Strip 127 is common to the two photodiodes 125. The two photodiodes 125 are symmetrical to each other with respect to strip 127. Each memory area 104 is thus located opposite another memory area 104, separated by strip 127.

Conversely to FIG. 1, where strip 110 is a continuous strip all along the length of the photodiode, the strip 127 common to the two photodiodes 125 comprises openings 129. Similarly, strip 112 comprises openings 131 at the level of openings 129.

In the example of FIG. 2, strip 127 comprises two openings 129. Each strip 112 thus comprises two openings 131. Each memory area 104 of one of the two photodiodes is coupled to a memory area 104 of the other one of the two photodiodes 125 by two openings 131 and one opening 129.

Opening 129 and the two openings 131 are for example located between the two openings 116. The two openings 116 of the two memory areas 104 are thus coupled by opening 129 and the two openings 131.

The operation of photodiodes 125 is identical to the operation of photodiode 100. The different elements of photodiodes 125 are for example controlled identically, and at the same times.

Figure 3:
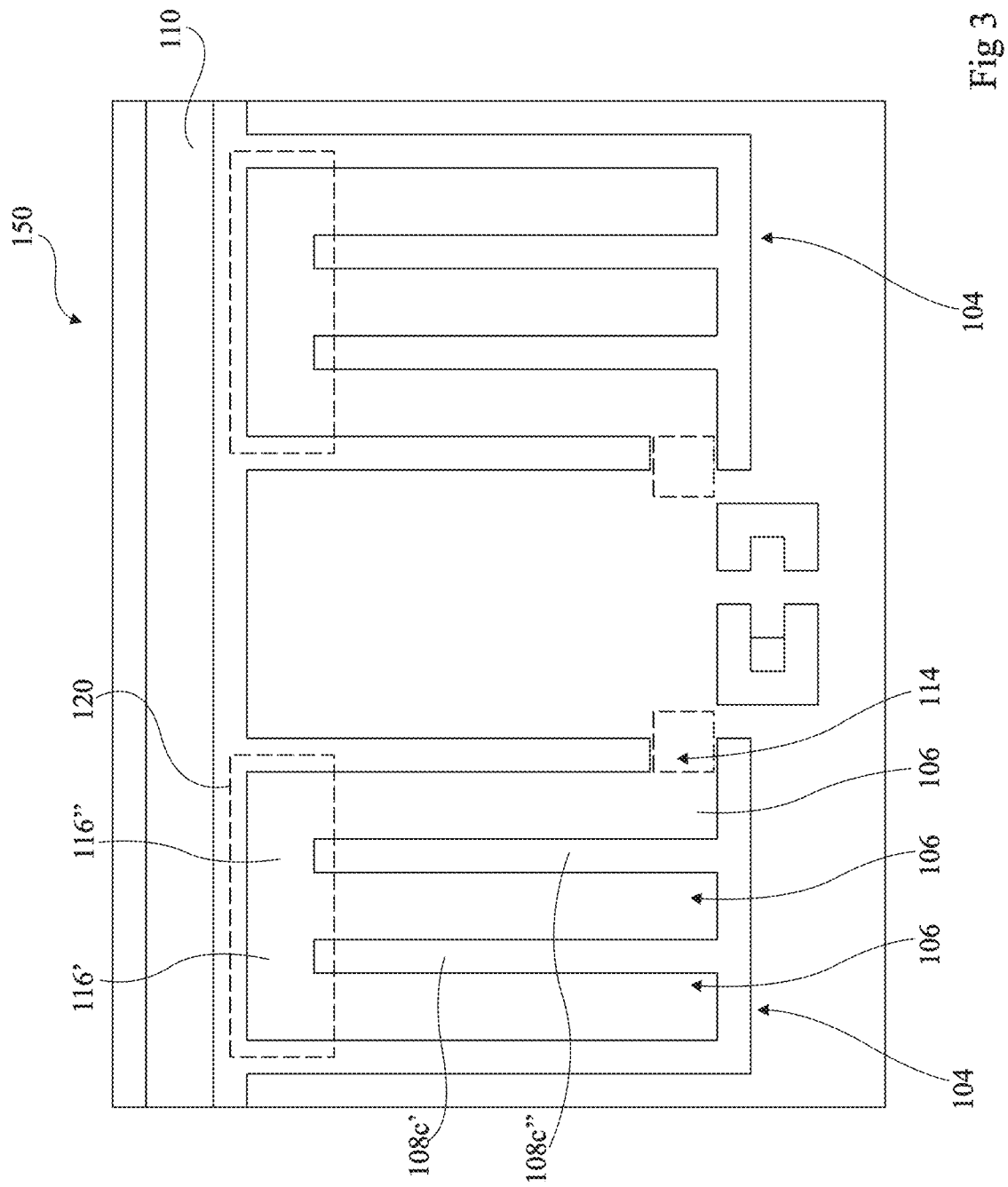
FIG. 3 shows another embodiment of a photodiode.

FIG. 3 shows another embodiment of a photodiode 150.

Photodiode 150 is identical to photodiode 100, except for the number of electron storage regions 106. The elements common between photodiode 150 and photodiode 100 are designated with the same references and are not detailed again.

Photodiode 150 comprises, in each memory area 104, three electron storage regions 106. The three storage regions, as in FIG. 1 and in FIG. 2, for example substantially have the shape of a parallelogram. Further, regions 106 have a main direction substantially parallel to one another, in some embodiments, parallel to the main direction of all the regions 106 of the photodiode. Regions 106 are separated from one another by insulated conductive walls 108c' and 108c". Walls 108c' and 108c" are identical to the walls 108c of FIG. 1.

Each of walls 108c' and 108c" respectively forms an opening 116' and 116". In some embodiments, openings 116' and 116" are located on the same side of memory area 104, for example, on the side opposite to opening 114 in the main direction of regions 106.

The pad 120 of each memory area 104 is identical to the pads 120 described in relation with FIG. 1 and covers at least the two openings 116' and 116". In some embodiments, each pad 120 extends from wall 108a to wall 108b.

The operation of photodiode 150 is the same as the operation of photodiode 100 of FIG. 1.

Two photodiodes 150 may be arranged in the same way as photodiodes 125 are arranged in FIG. 2, that is, sym-metrically to each other with respect to a strip 127 replacing strip 110. Openings 129 and 131 are for example located in strip 110 between the two openings 116' and 116".

Figure 4:
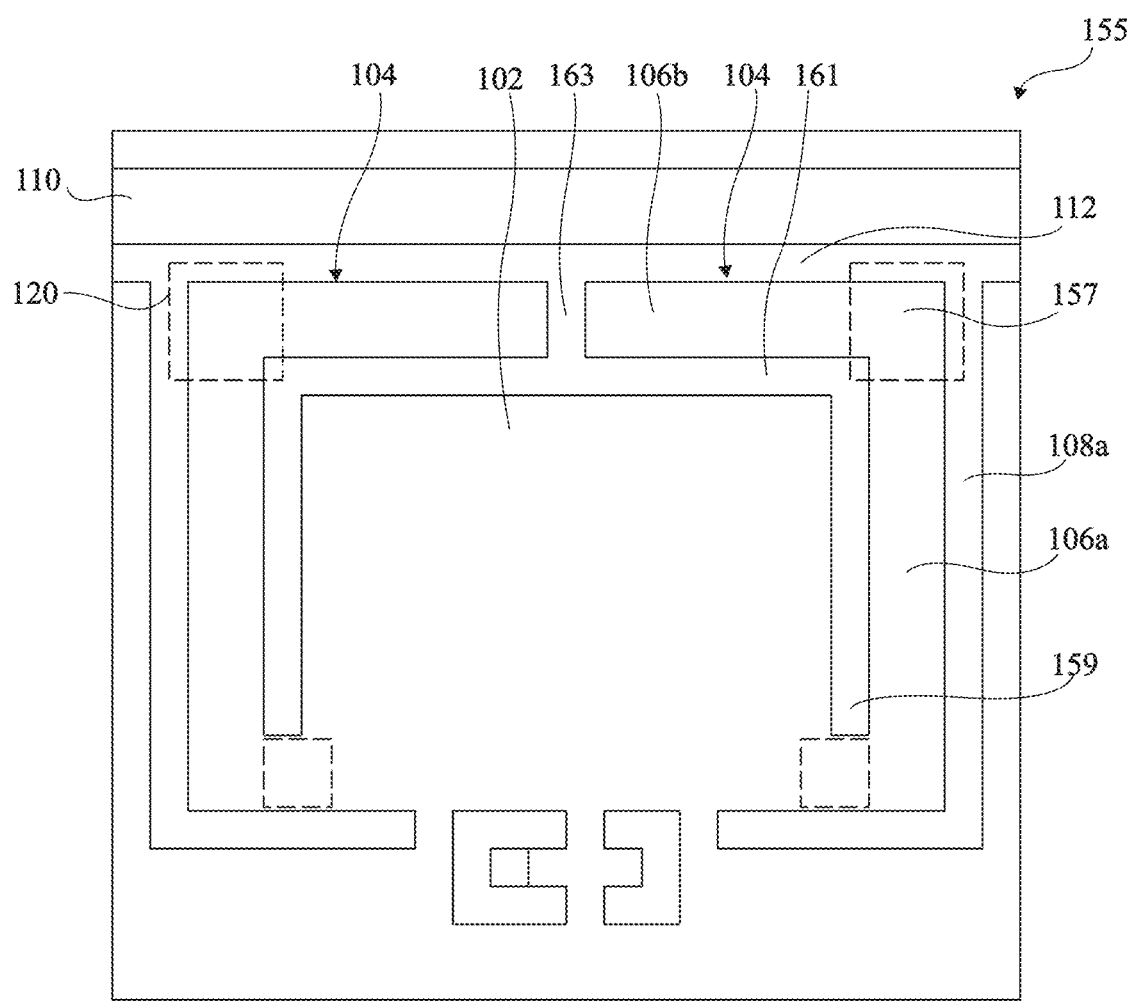
FIG. 4 shows another embodiment of a photodiode.

FIG. 4 shows another embodiment of a photodiode 155. Photodiode 155 comprises elements identical to the elements of FIG. 1, designated with the same references. These elements are not detailed again.

The photodiode 155 of FIG. 4 differs from the photodiode 100 of FIG. 1 in that the storage regions 106 of a memory area 104 do not extend in directions parallel to each other, but in substantially perpendicular directions, in some embodiments. The storage regions thus have, for each memory area 104, substantially an L shape.

Each memory area 104 comprises a region 106a extending along wall 108a and a region 106b extending along wall 112. Regions 106a and 106b meet in a region 157 located at the level where walls 108a and 112 meet.

Region 106a is separated from active area 102 by a wall 159. Region 106b is separated from active area 102 by a wall 161. The regions 106b of the two memory areas 104 are separated by a wall 163. Walls 159, 161, and 163 are insulated conductive walls, similar to walls 108.

Pad 120 covers region 157. For example, pad 120 partially covers wall 112, wall 108a, wall 159, and wall 161. Conductive pads 120 do not cover active area 102. Conductive pads 120 do not cover strip 110.

In the example of FIG. 4, active area 102 is separated from wall 112 all along the length of active area 102 by regions 106b, walls 163, and walls 161. The dimensions of regions 106b and the dimensions of wall 163 ascertain that active area 102 is not in contact with wall 112.

As a variation, a portion (not shown) of active area 102 may be located between the two regions 106b. Each of regions 106b would thus be separated from this portion of the active area by an insulated conductive wall similar to wall 163. The dimensions of regions 106b in their main direction, that is, the direction in which wall 112 extends, would then be smaller than the dimension of regions 106b in their main direction in the case of FIG. 4. Active area 102 would thus be in contact with wall 112.

Like the photodiode 150 of FIG. 3, two photodiodes 155 may be arranged in the same way as photodiodes 125 are arranged in FIG. 2, that is, symmetrically to each other with respect to a strip 127 replacing strip 110. Openings 129 and 131 are for example located at the level of region 157.

The operation of photodiode 155 is substantially identical to the operation of the photodiodes 100, 125, and 150 of the previous drawings.

Figure 5:
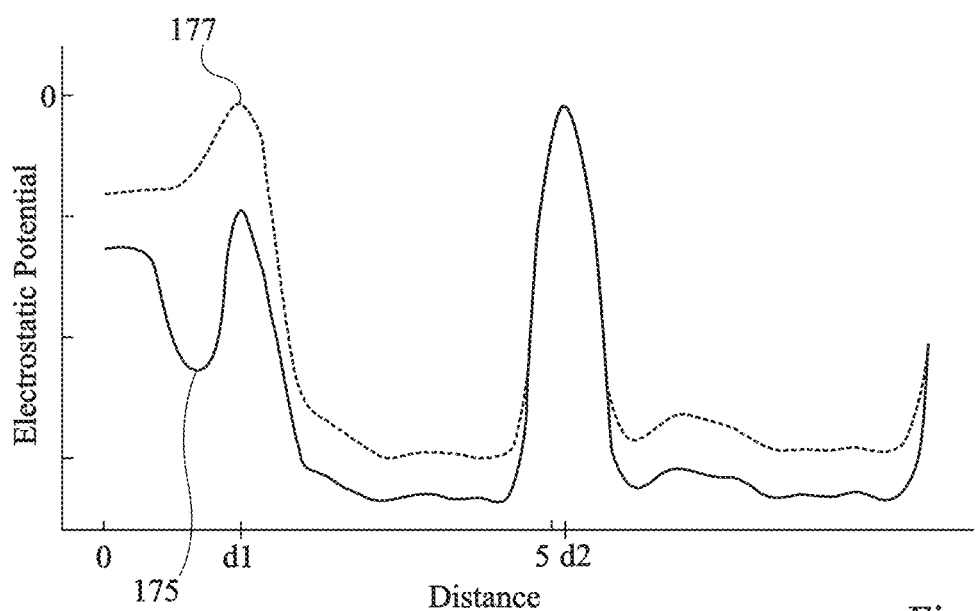
FIG. 5 shows the electrostatic potential on the electron path in the embodiment of FIG. 1.

FIG. 5 shows the electrostatic potential on an electron path in the embodiment of FIG. 1.

The origin of the electron path, corresponding to the origin of the abscissa (distance), is located in an active area 102. The path of the considered electrons then extends into one of openings 114, into the region 106 closest to active area 102, into opening 116, and into the other region 106.

The ordinate corresponds to the electrostatic potential on the electron path. The ordinate is shown in such a way that the positive values are directed downwards and the negative values are directed upwards on the axis of ordinates.

FIG. 5 comprises a first full line curve 175 and a second dotted line curve 177. Curve 175 corresponds to the maximum electrostatic potential across a thickness from 0.1 μm to 2 μm in the semiconductor material on the path. The thickness is measured from the upper surface of the substrate, that is, the surface shown in FIG. 1. Curve 177 corresponds to the maximum electrostatic potential across a thickness in the range from 0.3 μm to 2 μm in the semiconductor material on the path. Thus, curve 175 includes a portion of the substrate located above the portion considered for curve 177.

In the example of FIG. 5, it is considered that pads 118 receive a positive voltage, for example, 1.1 V. It is further considered that pad 120 receives a negative voltage, for example, −1 V. The values of curves 175 and 177 correspond to a time during the electron generation step, before the reading step.

The opening 114 of memory area 104 corresponds to a distance d1, for example, approximately 1.5 μm, on the electron path.

At the level of distance d1, curves 175 and 177 both have an extremum. Such an extremum represents a first barrier to be crossed by the electrons. Thus, when the quantity of electrons is sufficient in active area 102, that is, at a distance shorter than d1, the electrons enter first region 106. First region 106 thus corresponds to a distance between distance d1 and a distance d2. Distance d2 is for example substantially equal to 5.25 μm. Between d1 and d2, the electrostatic potential is much lower than at distances d1 and d2. Distance d2 corresponds to opening 116. At distance d2, curves 175 and 177 have an extremum. It is a second barrier. Thus, when the number of electrons is sufficient in first region 106, the electrons flow into second region 106. For distances greater than distance d2, curves 175 and 177 represent the electrostatic potential in second region 106.

Thus, for a memory area 104, the region 106 closest to active area 102 is first filled and then, when this region is filled, the electrons are transferred into the region 106 most distant from active area 102.

The memory areas such as those described in relation with FIG. 1 thus enable to obtain an electron storage capacity greater than the storage capacity of a memory only comprising one electron storage region.

It could have been chosen to increase the dimensions of a storage region without adding a second region 106 separated by an opening 116. However, the single storage region would then comprise, particularly in deep regions, regions where it would be difficult to read the electrons.

FIGS. 6A, 6B and 7A, 7B show two views along cross-section A-A of FIG. 2.

The first views, 6A and 7A, show the doping levels in the concerned portion. The second views, 6B and 7B, show the electrostatic potential in this same portion, respectively in the portion shown in view 6A and 7A, during the reading step, that is, when connection pad 120 receives a voltage having a positive value.

Although FIGS. 6A, 6B and 7A, 7B are described in relation with FIG. 2, the observations which have been made are also valid for embodiments comprising two photodiodes 100, 150, or 155 symmetrical to each other with respect to a strip 127 as well as for the embodiments of the other drawings.

Views 6A, 6B, 7A, and 7B show an insulated conductive wall 200 comprising a conductive core 202 and an insulating coating 204. Wall 200 for example corresponds to the wall 108c of FIG. 2. The views further show conductive pad 120. The views further show the semiconductor material of the electron storage regions and more particularly the semiconductor material of opening 116, of opening 131, and of opening 129.

Figure 6A:
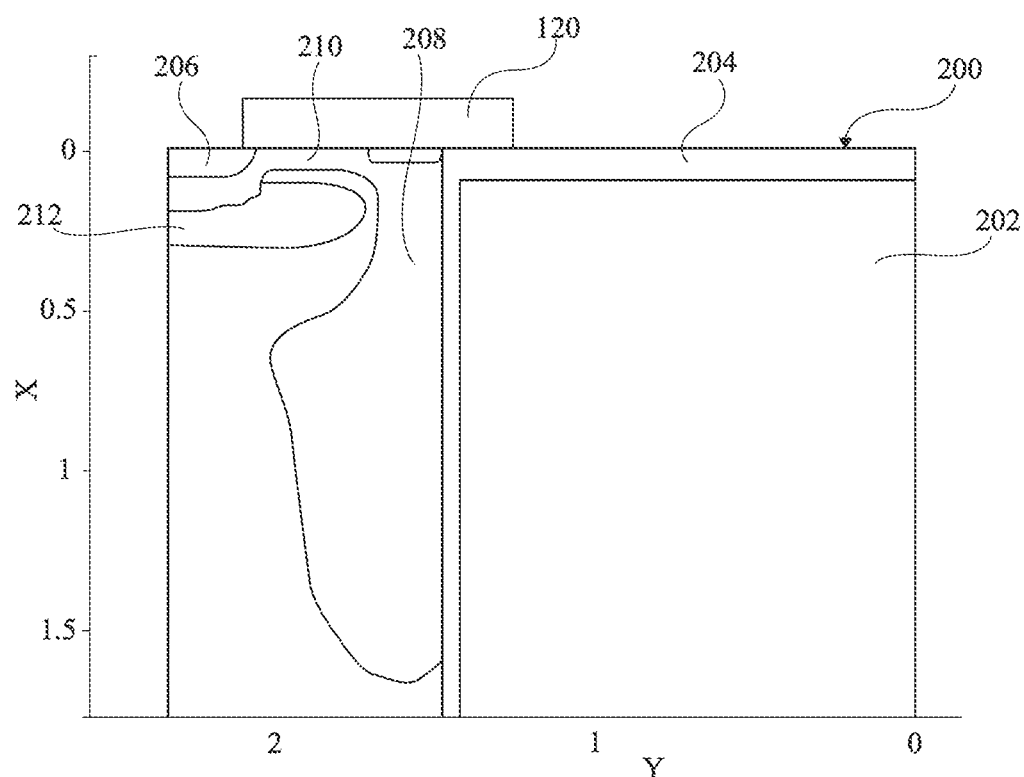
FIGS. 6A and 6B show the electrostatic potential in a portion of one of the embodiments of FIGS. 1 to 4.

In FIG. 6A, the doping of the semiconductor material located in opening 129 which is however not located under connection pad 120, is greater than approximately $10^{\wedge}18$ dopants/cm$^{\wedge}$3 (symbol ^ representing the power function), across a thickness substantially equal to 0.2 μm. This substantially corresponds to a region 206 of view 6A.

The doping of the semiconductor material located in opening 116, more precisely along wall 200, is in the range from approximately $10^{\wedge}10$ dopants/cm$^{\wedge}$3 to $10^{\wedge}18$ dopants/cm$^{\wedge}$3, for a depth ranging up to 1.5 μm. This substantially corresponds to a region 208 of view 6A. The concentration is for example decreasing in region 208 from the surface of opening 116.

Regions 206 and 208 are coupled by a region 210. The doping of region 210 is for example in the range from approximately $10^{\wedge}15$ to $10^{\wedge}18$ dopants/cm$^{\wedge}$3. Region 210 is located at the surface of the semiconductor material. Region 210 is located in contact with pad 120. The thickness of region 210 is for example substantially equal to 0.1 μm. The thickness of region 210 is for example smaller than the thickness of region 206.

A region 212 located under regions 206 and 210 has a doping smaller than $-10^{\wedge}16$ dopants/cm$^{\wedge}$3. Region 212 is located just under regions 206 and 210. Region 212 for example extends from regions 206 and 210 down to a depth of approximately 0.5 μm.

The rest of the considered semiconductor material for example has a doping in the range from $-10^{\wedge}13$ to $-10^{\wedge}16$ dopants/cm$^{\wedge}$3.

Region 208 partially extends under region 212. The negative dopant concentrations correspond to a doping of a type opposite to the positive concentration doping. Thus, a doping smaller than a negative doping corresponds to a greater number of dopants of the type having their concentration corresponding to a negative value.

The dimensions of regions 210 and 212 are selected so that the path for electrons heading towards region 206 is relatively narrow. Thus, there are little risks of leakage.

Figure 6B:
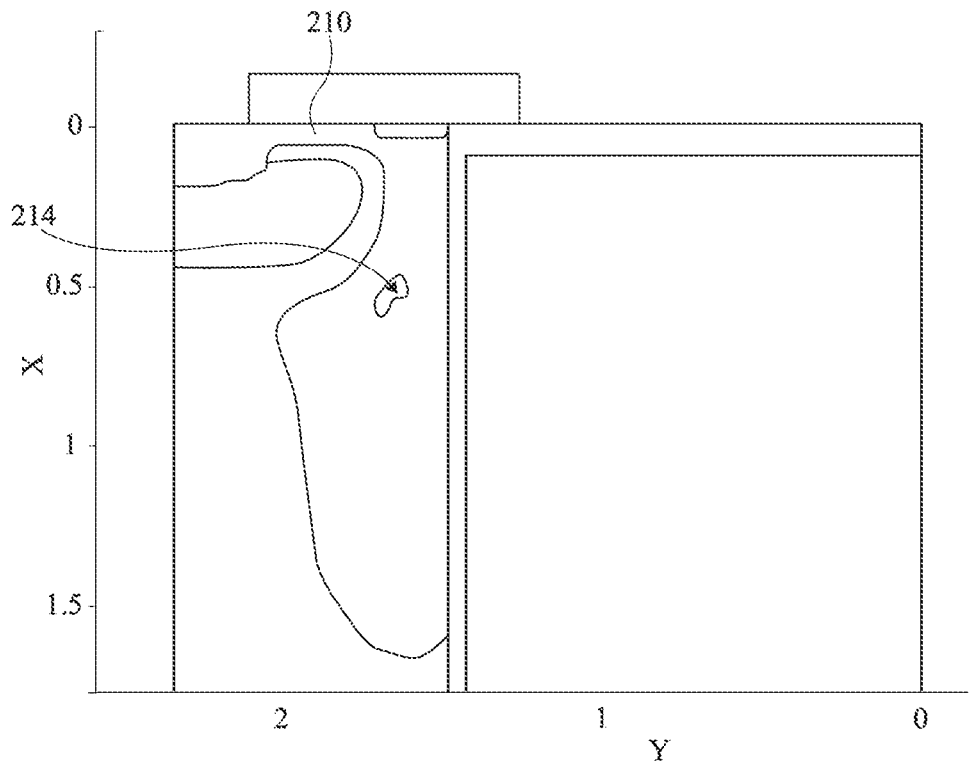

In FIG. 6B, it can be observed that the electrostatic potential is the highest in region 210 and in the portion of region 208 closest to region 210. A pocket 214 can also be observed within region 208, said pocket having an electrostatic potential value greater than the potential values of the portions of region 108 surrounding it. Pocket 214 forms an electron storage pocket, that is, during the reading, electrons will remain stored in this pocket and will not displace towards region 206 to be read. The read value is thus not entirely representative of the number of electrons which were present in the memory, and thus of the number of electrons which have been generated by the photodiode.

View 7A is similar to view 6A. View 7A differs from view 6A in that region 212 extends deeper. Thus, region 212 extends down to approximately 0.7 μm. Further, region 212 is more lightly doped, that is, a larger portion of region 212 has a doping smaller than $-10^{\wedge}18$ dopants/cm$^{\wedge}$3.

In view 7B, the absence of pocket 214 can be observed. The electrostatic potential gradually decreases from region 210.

During the reading step, no electrons will thus remain stored in pocket 214 and thus not be able to be read.

Thus, the presence of a region 212 extending deeper enables to ensure the absence of pocket 214.

Figure 7A:
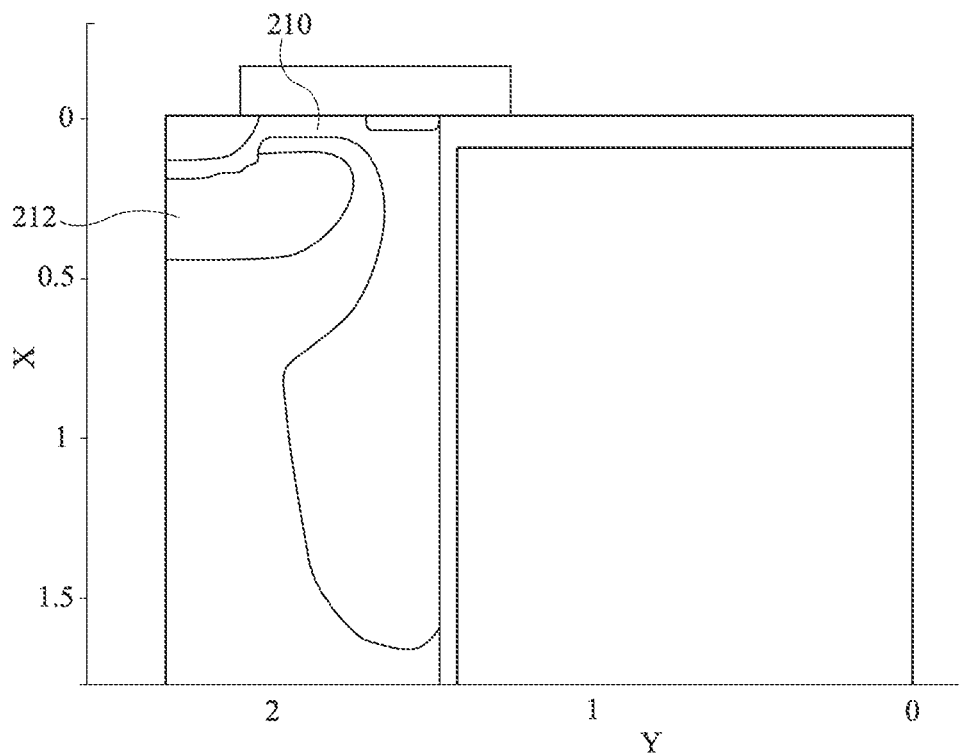
FIGS. 7A and 7B show the electrostatic potential in a portion of one of the embodiments of FIGS. 1 to 4.
Figure 7B:
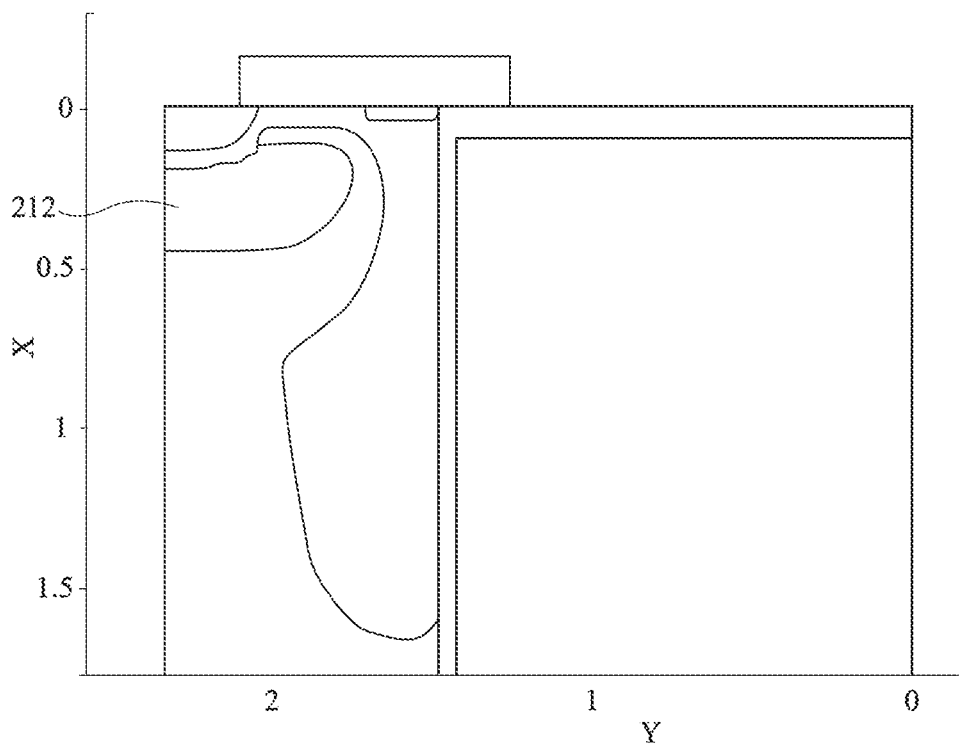
Figure 8:
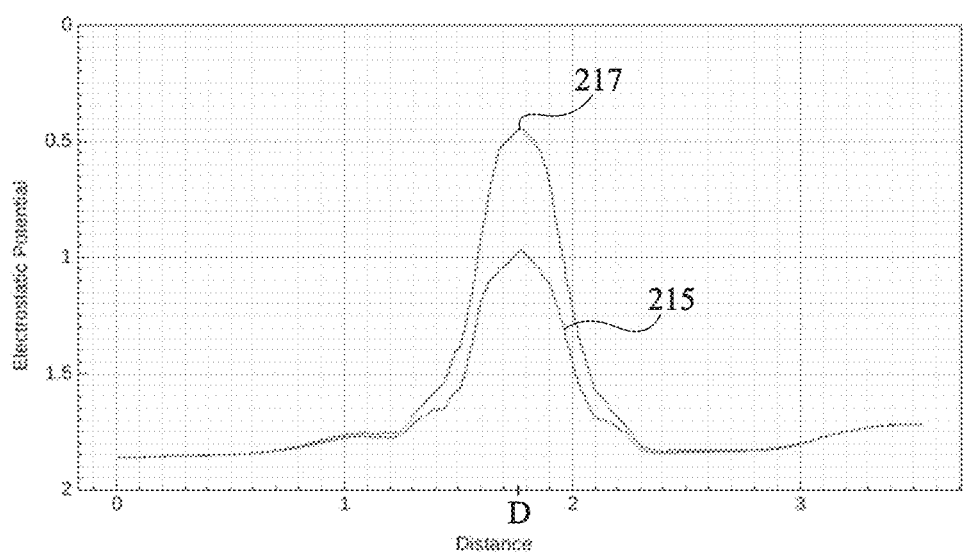
FIG. 8 shows the electrostatic potential in a portion of one of the embodiments of FIGS. 1 to 4.

FIG. 8 shows the electrostatic potential on a path extending from the first electron storage region to the second electron storage region of a same memory area in two different cases. Curve 215 corresponds to the case of FIGS. 6A, 6B and curve 217 corresponds to the case of FIG. 7.

It can be observed that each curve comprises an extremum located at the same distance D. Distance D corresponds to opening 116, that is, to the location where it is passed from the first region to the second region. Such a maximum thus corresponds to the barrier to be crossed by electrons to pass into the second electron storage region.

It can be observed that by passing from the case of FIGS. 6A, 6B to the case of FIGS. 7A, 7B, that is, by increasing the thickness of region 212, the barrier to be crossed by the electrons is increased.

The inventors have determined that by increasing the thickness of region 212, it is possible to remove the presence of electron storage pockets, which however increases the barrier to be crossed between two electron storage regions. This may raise issues, particularly in the case where the barrier located between the active area and the first electron storage region is smaller than the barrier between the two storage regions. Indeed, certain electrons might then return to the active area rather than cross the barrier towards the second region.

The inventors have further determined that increasing the distance between wall 108c and region 212 causes a decrease in the barrier between regions 106. However, this increases the dimensions of region 208 in depth. There thus is a risk for certain electrons, located in depth, not to be read.

Figure 9:
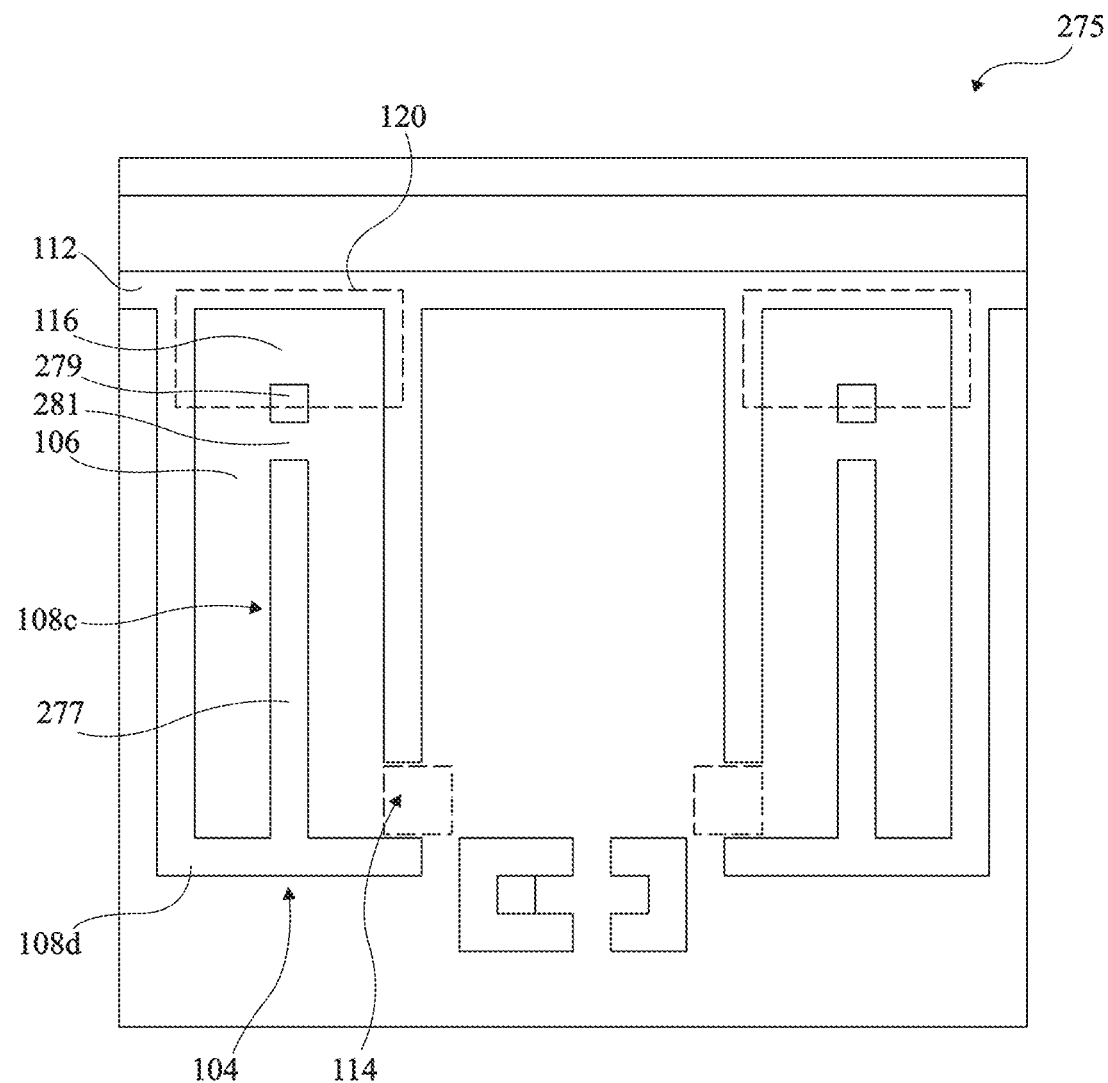
FIG. 9 shows another embodiment of a photodiode.

FIG. 9 shows another embodiment of a photodiode 275. Photodiode 275 comprises elements identical to the elements of FIG. 1, designated with the same references. These elements are not detailed again.

The photodiode 275 of FIG. 9 differs from the photodiode 100 of FIG. 1 in that each wall 108c comprises two distinct portions. Each wall 108c comprises a first portion 277 extending from wall 108d in the main direction of electron storage regions 106. Each wall 108c further comprises a second portion 279. Second portion 279 is located in line with first portion 277. The second portion is thus located between the first portion and wall 112. First portion 277 and 279 are separated by an opening 281.

Conductive pad 120 does not cover opening 281. Conductive pad 120 for example partially covers second portion 279.

The voltage received by the conductive core of the second portion 279 of wall 108c is independent from the voltage received by the conductive cores of the other insulated conductive walls 108 and 112. For example, the voltage received by the conductive core of the second portion is independent from the voltage received by the conductive core of the first portion 277 of wall 108c.

In some embodiments, opening 281 is as close to pad 120 as allowed by current technologies without being located under pad 120. For example, the dimension of second portion 279 in the main direction of electron storage regions 106 is for example substantially equal to 0.4 μm. The dimension of opening 281 in the main direction of electron storage regions 106 is for example substantially equal to 0.2 μm. In some embodiments, the dimension of first portion 277 in the main direction of regions 106 is at least five times greater than the dimension in the same direction of second portion 279, in some embodiments, at least ten times greater.

The operating steps of this embodiment are identical to those of the embodiment of FIG. 1. However, during the step of electron generation in active area 102 and of electron storage, the electrons displace from the storage area closest to the active area to the other storage region via opening 281. Indeed, the electrostatic potential barrier is smaller in opening 281 than in opening 116. In some embodiments, the electrostatic potential barrier of opening 281 is smaller than the barrier of opening 114.

As a variation, conductive pads 120 may be U-shaped. For example, each conductive pad 120 comprises a main portion identical to the conductive pads 120 of FIG. 9, and two secondary portions, not shown, each extending above one of storage regions 106. The secondary portions do not extend above opening 281.

Figure 10:
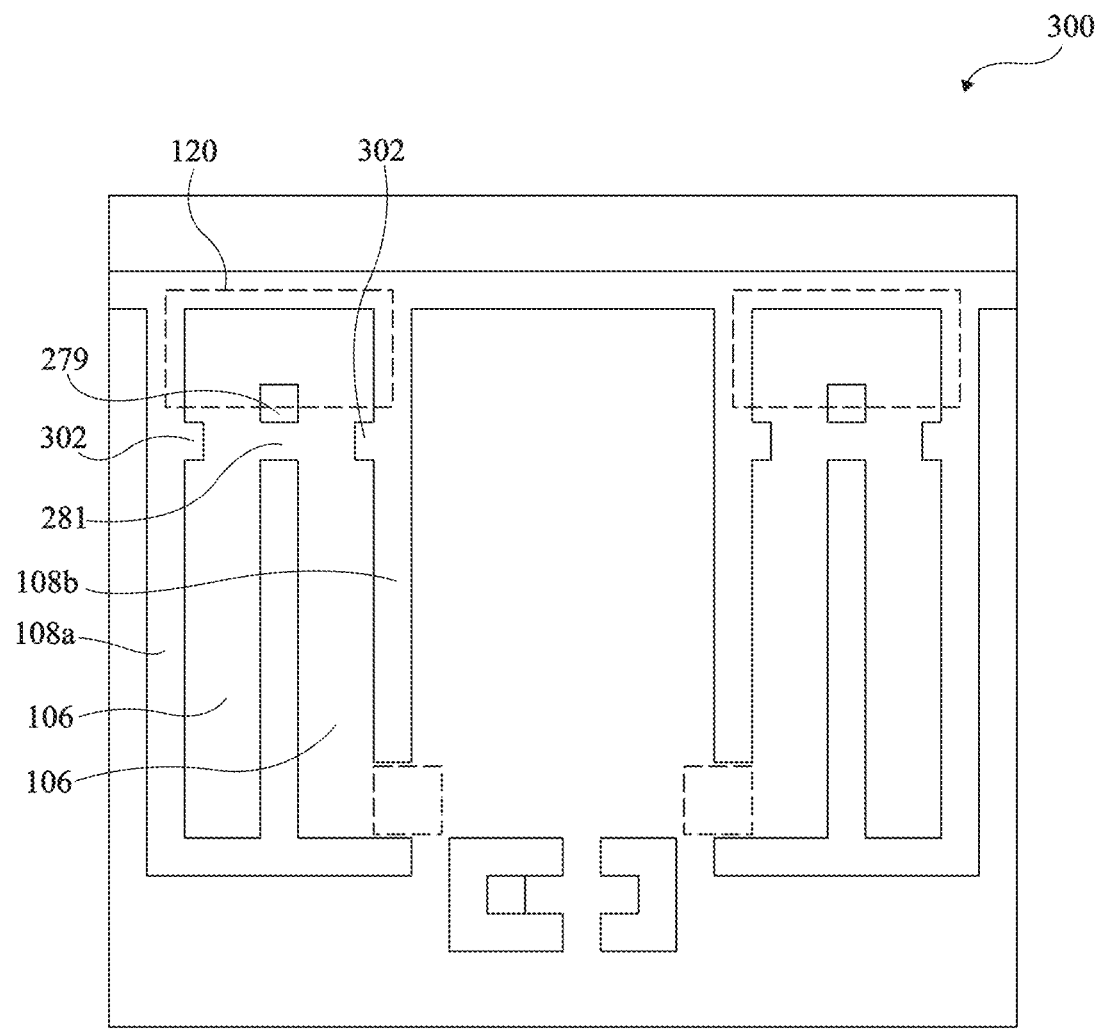
FIG. 10 shows another embodiment of a photodiode.

FIG. 10 shows another embodiment of a photodiode. Photodiode 300 comprises elements identical to the elements of FIG. 9, referenced in the same way. These elements are not detailed again.

Photodiode 300 differs from photodiode 275 in that walls 108a and 108b comprise protruding portions 302. Walls 108a and 108b thus comprise a main portion and a protruding portion 302. The main portions of walls 108a and 108b are identical to the walls 108a and 108b of FIG. 9. Portions 302 extend from the main portions to storage regions 106. Portions 302 are, in some embodiments, located on either side of opening 281. In some embodiments, portions 302 are thus not covered, even partially, with conductive pad 120.

The presence of portions 302 enables to decrease the electrostatic potential barrier of opening 281.

Figure 11A:
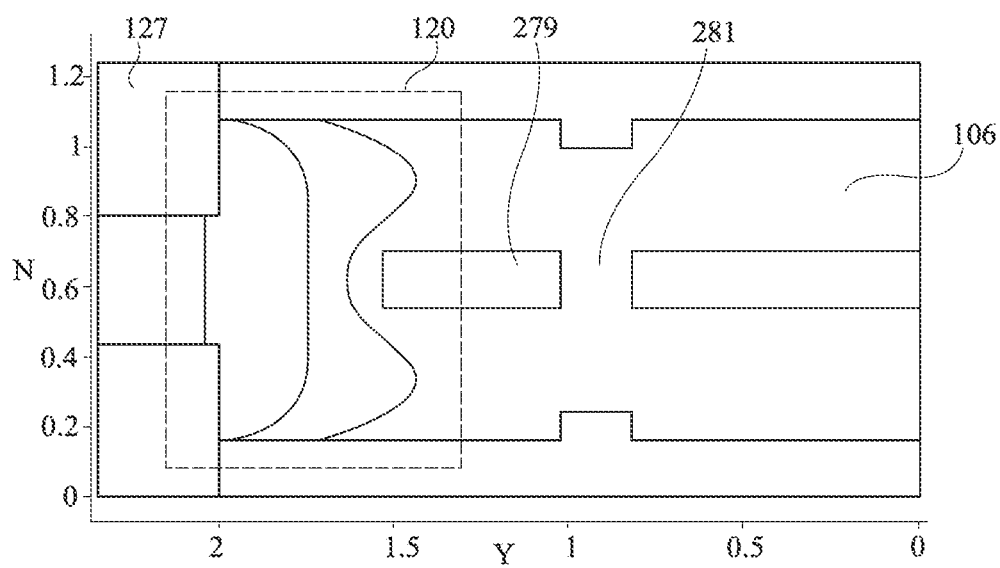
FIGS. 11A, 11B and 11C show the electrostatic potential in a portion of the embodiment of FIG. 10 during three operating steps.
Figure 11B:
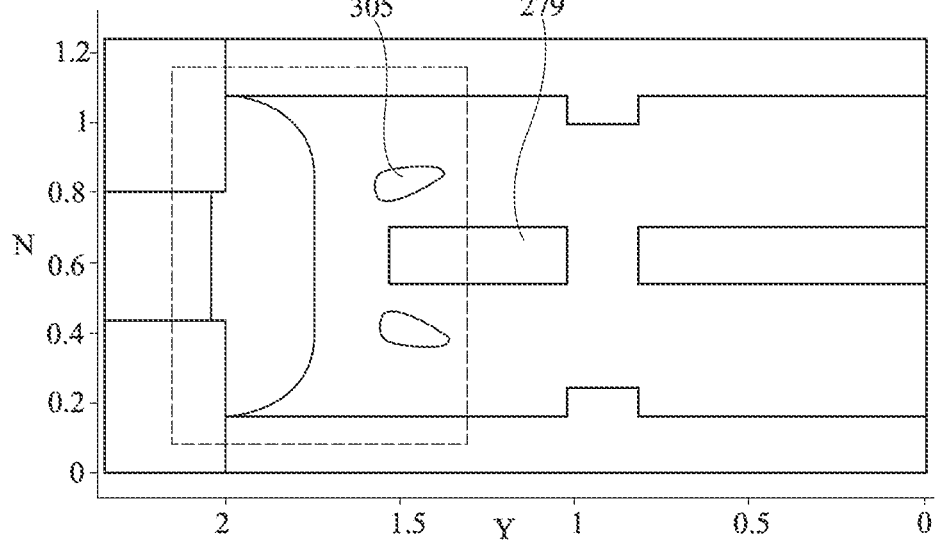
Figure 11C:
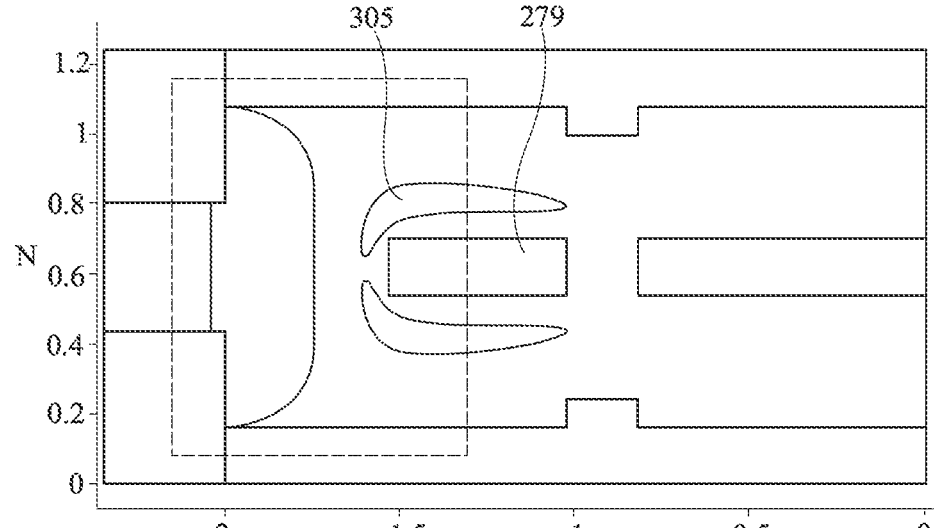

FIGS. 11A-11C show the electrostatic potential in a portion of the embodiment of FIG. 10 during three operating steps. FIGS. 11A-11C comprise axes Y and Z representing distances in micrometers. Axis Y is in the main direction of regions 106 and axis Z is in the direction perpendicular to axis Y in the plane of FIGS. 11A-11C.

Although the observations have been made in relation with the embodiment of FIG. 10 in a structure comprising two symmetrical photodiodes similar to FIG. 2, similar observations may be made in relation with the embodiment of FIG. 9 and with the embodiment of FIG. 13, which will be described hereafter.

FIGS. 11A-11C show a portion only of one of memory areas 104, for example, the portion comprising conductive pad 120, portions 277 and 279 of wall 108c, opening 281, a portion of strip 127, and opening 129.

The three steps described in relation with FIG. 1 are steps of the reading from one of memory areas 104.

During a first step, illustrated in the view of FIG. 11A, pad 120 receives a positive voltage. Further, the portion 279 of wall 108c receives a negative voltage, for example, the same voltage as the voltage received by the other insulated conductive walls, for example, a voltage substantially equal to −2 V.

The electrostatic potential under conductive pad 120 is in the range from approximately 2 to 3 V. The value of the potential decreases as the distance to strip 127 increases, according to potential curves similar to curves 303 and 304. The potential in storage regions 106 is in the range from approximately 0.8 V to 2.5 V.

The electrons head towards conductive pad 120.

During a second step, illustrated in the view of FIG. 11B, the value of the voltage received by portion 279 increases, for example, to reach a value substantially equal to 0 V.

The electrons still head towards conductive pad 120. However, electron storage pockets 305 start forming on either side of portion 279. The electron storage pockets are locations at which there is an extremum of the electrostatic potential.

During a third step, illustrated in the view of FIG. 11C, the value of the voltage received by portion 279 increases, for example, to reach the value of the voltage received by conductive pad 120, for example, to reach a value substantially equal to 2.5 V.

The electrons head towards conductive pad 120. The dimensions of storage pockets 305 increase. For example, storage pockets 305 extend along portion 279, for example, along the entire height of portion 279.

During a next step, not illustrated, the voltage received by portion 279 is negative again.

The electrostatic potentials then become similar to those of view of FIG. 11A. The electrons stored in pockets 305 are then attracted by pad 120. Pockets 305 are for example located at the level of the upper surface of regions 106. Thus, the electrons are easily attracted from the pockets to pad 120, and do not remain stored in depth.

The voltage of pad 120 then becomes negative again to stop the reading step.

Figure 12:
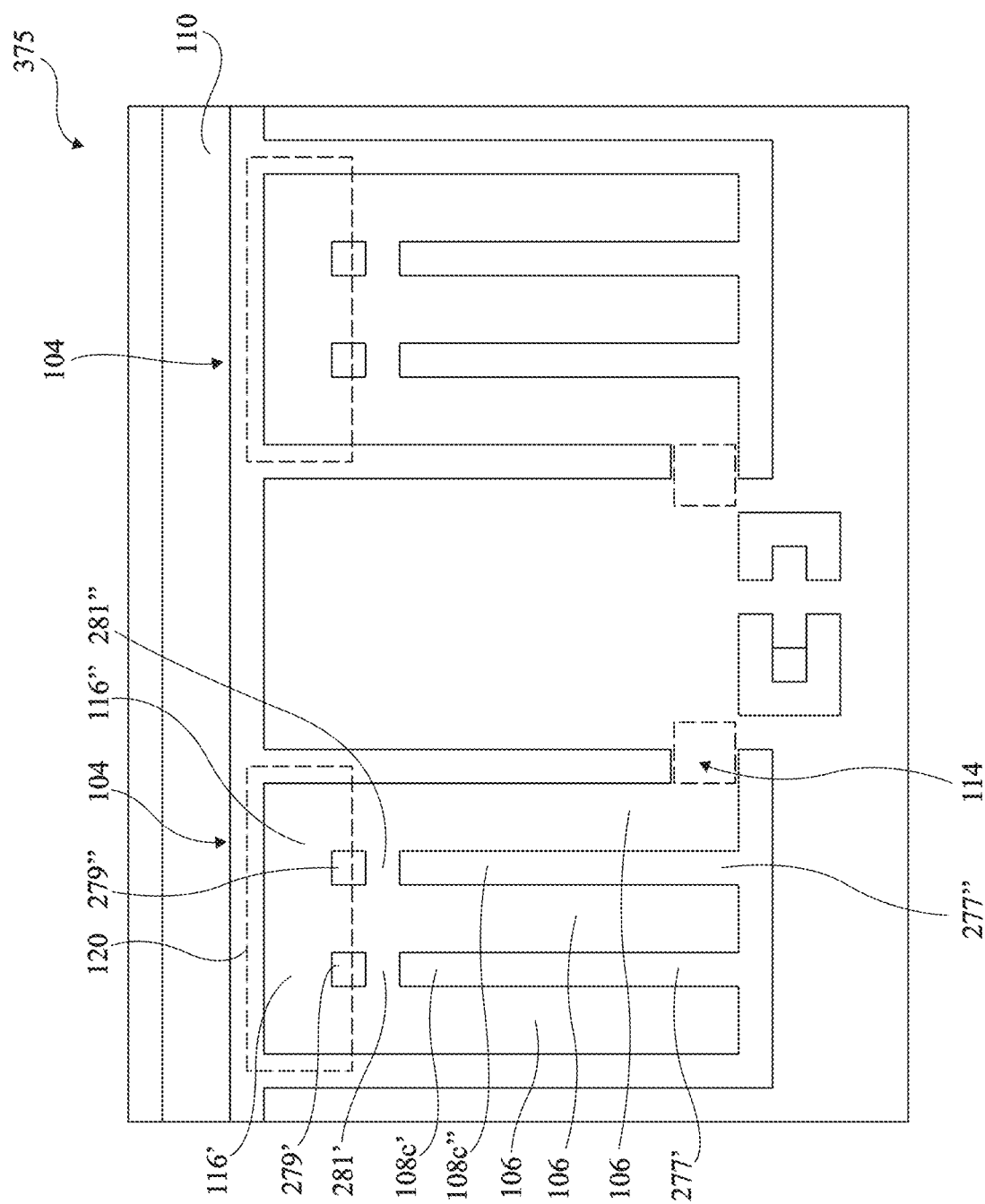
FIG. 12 shows another embodiment of a photodiode.

FIG. 12 shows another embodiment of a photodiode 375.

Photodiode 375 is identical to photodiode 275, except for the number of electron storage regions 106. The elements common between photodiode 275 and photodiode 375 are designated with the same references and are not detailed again.

Photodiode 375 comprises, in each memory area 104, three electron storage regions 106. The three storage regions, as in FIG. 3, for example substantially have the shape of a parallelogram. Further, regions 106 have a main direction substantially parallel to one another, in some embodiments, parallel to the main direction of all the regions 106 of the photodiode. Regions 106 are separated from one another by insulated conductive walls 108c' and 108c". Walls 108c' and 108c" are identical to the walls 108b of FIG. 1.

Each of walls 108c' and 108c" respectively comprises an opening 116' and 116". In some embodiments, openings 116' and 116" are located on the same side of memory area 104, for example, on the side opposite to opening 114.

The pad 120 of this memory area 104 is identical to the pads 120 described in relation with FIG. 9 and covers at least the two openings 116' and 116".

Each wall 108c' or 108c" comprises two different portions. Each wall 108c', respectively 108c", comprises a first portion 277', respectively 277", extending from wall 108d in the main direction of electron storage regions 106. Each wall 108c', respectively 108c", further comprises a second portion 279', respectively 279". Second portion 279', respectively 279", is located in line with first portion 277', respectively 277". Each second portion is thus located between the first corresponding portion and wall 112. Each first portion 277' or 277" and second portion 279' or 279" are separated by an opening 281' or 281".

Conductive pad 120 does not cover openings 281' and 281". Conductive pad 120 for example partially covers second portions 279' and 279".

The voltage received by the conductive core of the second portions 279' and 279" of walls 108c' and 108c" is independent from the voltage received by the conductive cores of the other insulated conductive walls 108 and 112. For example, the voltage received by the conductive core of each second portion 279' or 279" is independent from the voltage received by the conductive core of the corresponding first portion 277' and 277" of wall 108c' or 108c".

In some embodiments, each opening 281' or 281" is as close to pad 120 as allowed by current technologies without being located under pad 120. For example, the dimension of each second portion 279' or 279" in the main direction of electron storage regions 106 is for example substantially equal to 0.4 μm. The dimension of each opening 281' or 281" in the main direction of electron storage regions 106 is for example substantially equal to 0.2 μm. In some embodiments, the dimension of each first portion 277' or 277" in the main direction of regions 106 is at least five times greater than the dimension in the same direction of the corresponding second portion 279' or 279", in some embodiments, at least ten times greater.

The operation of photodiode 375 is the same as the operation of photodiode 300.

Two photodiodes 375 may be arranged in the same way as photodiodes 125 are arranged in FIG. 2, that is, symmetrically to each other with respect to a strip 127 replacing strip 110. Openings 129 and 131 are for example located in strip 110 between the two openings 116' and 116".

An advantage of the embodiments of FIGS. 9, 10, and 12 is that openings 281 allow a less difficult passage between the different storage regions of the memory areas, by lowering the electrostatic potential barrier between the regions.

Another advantage of the embodiments of FIGS. 9, 10, and 12 is that the voltage received by the second portion 279 of walls 108c enables to better attract charges, for example charges which might have been located in depth in the memory area and might then not be read.

The disclosure can be further understood through the following alternative or additional embodiments:

In a first alternative or additional embodiment, a photodiode comprises: a first active area; and a first memory area adjacent to the first active area. the first memory area includes: a first storage region and a second storage region; a first insulated conductive wall proximal to the first active area and between the first storage region and the first active area; a first opening in the first insulated conductive wall, the first opening extending between the first storage region and the first active area; a second insulated conductive wall between the first storage region and the second storage region; and a second opening in the second insulated conductive wall, the second opening extending between the first storage region and the second storage region.

The foregoing and other described embodiments can each, optionally, include one or more of the following features:

A first feature, combinable with any of the preceding or following features, specifies that the photodiode further includes: a semiconductor region; a third insulated conductive wall partially surrounding the semiconductor region; and a third opening in the third insulated conductive wall and extending between the semiconductor region and the active area.

A second feature, combinable with any of the preceding or following features, specifies that the photodiode further includes a first connection pad overlapping the first opening.

A third feature, combinable with any of the preceding or following features, specifies that the photodiode further includes a second connection pad overlapping the second opening.

A fourth feature, combinable with any of the preceding or following features, specifies that the photodiode further includes: a second active area and a second memory area adjacent to the second active area. The second memory area includes: a third storage region and a fourth storage region; a third insulated conductive wall proximal to the second active area and between the third storage region and the second active area; a third opening in the third insulated conductive wall, the third opening extending between the third storage region and the second active area; a fourth insulated conductive wall between the third storage region and the fourth storage region; and a fourth opening in the fourth insulated conductive wall, the fourth opening extending between the third storage region and the fourth storage region. The photodiode also includes a fifth opening extending between the second opening and the fourth opening.

A fifth feature, combinable with any of the preceding or following features, specifies that the first opening is proximal to a first end of the first memory area and the second opening is proximal to a second end of the first memory area that is opposite to the first end.

A sixth feature, combinable with any of the preceding or following features, specifies that the first end and the second end are opposite to one another in a longitudinal direction of the first memory area.

In a second alternative or additional embodiment, a photodiode includes: an active area; and a memory area, the memory area including at least two charge storage regions and a first wall, the at least two charge storage regions being partially separated from one another by the first wall, an opening in the first wall extending between two charge storage regions of the at least two charge storage regions.

The foregoing and other described embodiments can each, optionally, include one or more of the following features:

A seventh feature, combinable with any of the preceding or following features, specifies that the memory area comprises exactly two storage regions.

An eighth feature, combinable with any of the preceding or following features, specifies that the opening is proximal to a first end of each of the at least two charge storage regions in a longitudinal direction.

A ninth feature, combinable with any of the preceding or following features, specifies that the wall is an insulated conductive wall.

A tenth feature, combinable with any of the preceding or following features, specifies that the photodiode includes a connection pad, wherein the opening is at least partially covered by the connection pad.

An eleventh feature, combinable with any of the preceding or following features, specifies that each of the at least two storage regions has substantially a shape of a parallelogram.

A twelfth feature, combinable with any of the preceding or following features, specifies that each of the at least two storage regions has a main dimension in a main direction that is greater than other dimensions of the storage region in other directions, and main directions of the at least two storage regions are parallel to one another.

A thirteenth feature, combinable with any of the preceding or following features, specifies that the memory area comprises at least three storage regions having parallel main directions.

A fourteenth feature, combinable with any of the preceding or following features, specifies that each of the at least two storage regions has a main dimension in a main direction that is greater than other dimensions of the storage region in other directions, and the main directions of the at least two storage regions of the memory area are perpendicular to one another.

A fifteenth feature, combinable with any of the preceding or following features, specifies that the memory area includes walls including the first wall, the at least two storage regions are each at least partially surrounded by the walls, and the walls are insulated conductive walls.

A sixteenth feature, combinable with any of the preceding or following features, specifies that each insulated conductive wall comprises a conductive core and an insulating coating, the conductive code is configured to receive, during an operation of the photodiode, a negative voltage, and the insulating core is at least partially surrounded by the insulating coating.

In a third alternative or additional embodiment, a method, comprising generating electrons in an active area of a photodiode, the photodiode including a charge storage area adjacent to the active area, the charge storage area including a first charge storage region and a second charge storage region surrounded by an insulated conductive wall, a portion of the insulated conductive wall positioned between the first charge storage region and the second charge storage region, the first charge storage region and the second charge storage region sharing a common region, the insulated conductive wall including a first opening toward the active area; storing charges in the storage area by applying a positive voltage on the first opening and a negative voltage on the common region to attract electrons generated in the active area to move to the storage area; and reading a quantity of the charges stored in the storage area by applying a negative voltage on the first opening and a positive voltage on the common region to prevent electrons generated in the active area from moving to the storage area.

The foregoing and other described embodiments can each, optionally, include one or more of the following features:

A seventeenth feature, combinable with any of the preceding or following features, specifies that the first opening is proximal to a first end of the charge storage area, and the common region is proximal to a second end of the charge storage area that is opposite to the first end.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The various embodiments described above can be combined to provide further embodiments. Aspects of the embodiments can be modified to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A photodiode, comprising:
   an active area; and
   a memory area adjacent to the active area, the memory area including:
     a first storage region and a second storage region;
     a first insulated conductive wall proximal to the active area and between the first storage region and the active area, the first insulated conductive wall extending along a first direction;
     a first opening in the first insulated conductive wall, the first opening extending between the first storage region and the active area;

a second insulated conductive wall coupled to the first insulated conductive wall, the second insulated conductive wall extending along a second direction that is transverse to the first direction;

a third insulated conductive wall between the first storage region and the second storage region, the third insulated conductive wall including a first portion extending along the first direction and a second portion aligned with the first portion along the first direction, the second portion being separated from the first portion and being between the first portion and the second insulated conductive wall;

a second opening between the first portion and a first side of the second portion of the second insulated conductive wall, the second opening extending between the first storage region and the second storage region; and a third opening at a second side of the second portion that is opposite to the first side, the third opening extending between the first storage region and the second storage region.

2. The photodiode according to claim 1, further comprising:

a semiconductor region;

a fourth insulated conductive wall partially surrounding the semiconductor region; and a fourth opening in the fourth insulated conductive wall and extending between the semiconductor region and the active area.

3. The photodiode according to claim 1, further comprising a first connection pad overlapping the first opening.

4. The photodiode according to claim 1, further comprising a second connection pad overlapping the third opening.

5. The photodiode according to claim 4 wherein the second opening offsets with the second connection pad.

6. The photodiode according to claim 5 wherein the second connection pad at least partially overlaps the second portion.

7. The photodiode according to claim 1 wherein the first and second storage regions each include a first dimension in the first direction and a second dimension in the second direction, the first dimension being greater than the second dimension.

8. A photodiode, comprising:

at least one memory area including:

at least two charge storage regions;

insulated conductive walls including a first insulated conductive wall between two charge storage regions of the at least two charge storage regions, the first insulated conductive wall comprising:

a first portion having a first length that extends along a first direction; and a second portion aligned with the first portion along the first direction, the second portion having a second length along the first direction that is smaller than the first length; and a first opening and a second opening in the first insulated conductive wall, the second opening being between the first portion and the second portion, the two charge storage regions being coupled to one another by the first and second openings, wherein the at least two charge storage regions are each at least partially surrounded by the insulated conductive walls, wherein the insulated conductive walls include a second insulated conductive wall and a third insulated conductive wall positioned on two opposing sides of the first insulated conductive wall, the second insulated conductive wall and the third insulated conductive wall each including a portion that extends towards the second opening.

9. The photodiode according to claim 8, further comprising a connection pad, wherein the first opening is at least partially covered by the connection pad.

10. The photodiode according to claim 9 wherein the second opening is not covered with the connection pad.

11. The photodiode according to claim 9 wherein the connection pad is configured to read a value representative of a quantity of electrical charges stored in the memory area.

12. The photodiode according to claim 9 wherein the second opening is located proximal to the connection pad without being overlapped by the connection pad.

13. The photodiode according to 8 wherein each insulated conductive wall includes a conductive core and an insulating coating, each conductive core configured to receive, during an operation of the photodiode, a negative voltage, the conductive core being at least partially surrounded with the respective insulating coating.

14. The photodiode according to claim 8 wherein the first and second openings are separated by the second portion of the first insulated conductive wall.

15. A device, comprising:

an active area; and a memory area adjacent to the active area, the memory area including:

a first storage region and a second storage region;

a first insulated conductive wall between the first storage region and the active area, the first insulated conductive wall extending along a first direction;

a first opening in the first insulated conductive wall, the first opening between the first storage region and the active area;

a second insulated conductive wall extending along the first direction, the second insulated conductive wall being between the first storage region and the second storage region and comprising:

a first portion having a first length along the first direction and a first surface along the first length, the first surface being adjacent to the first storage region; and a second portion separated from the first portion, the second portion having a second length along the first direction that is smaller than the first length and a second surface that is coplanar to the first surface; and a second opening between the first portion and a first side of the second portion of the second insulated conductive wall, the second opening being between the first storage region and the second storage region.

16. The device of claim 15, further comprising a third opening at a second side of the second portion that is opposite to the first side, the third opening between the first storage region and the second storage region.

17. The device of claim 16, comprising:

a semiconductor region;

a third insulated conductive wall partially surrounding the semiconductor region; and a fourth opening in the third insulated conductive wall and between the semiconductor region and the active area.

* * * * *